(12) United States Patent
Liu et al.

(10) Patent No.: US 12,379,745 B2
(45) Date of Patent: Aug. 5, 2025

(54) PAD AND METHOD FOR MANUFACTURING A DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Shaokui Liu, Beijing (CN); Wei Qing, Beijing (CN); Xingguo Liu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 800 days.

(21) Appl. No.: 17/258,813

(22) PCT Filed: Mar. 20, 2020

(86) PCT No.: PCT/CN2020/080324
§ 371 (c)(1),
(2) Date: Jan. 8, 2021

(87) PCT Pub. No.: WO2021/184332
PCT Pub. Date: Sep. 23, 2021

(65) Prior Publication Data
US 2022/0141983 A1    May 5, 2022

(51) Int. Cl.
*H05K 5/03* (2006.01)
*H05K 5/00* (2025.01)

(52) U.S. Cl.
CPC ............. *H05K 5/03* (2013.01); *H05K 5/0017* (2013.01)

(58) Field of Classification Search
CPC .... G01F 1/00; G01F 1/16; G01F 1/1601; H05K 5/03; H05K 5/0017; B29C 53/00; B29C 53/02; B29C 53/04; B29C 53/36
(Continued)

(56) References Cited

U.S. PATENT DOCUMENTS 4,778,507 A * 10/1988 Aruga ............... B32B 17/10889
65/273
4,842,634 A * 6/1989 Vanaschen .......... C03B 23/0256
65/273

(Continued)

FOREIGN PATENT DOCUMENTS

JP         989932 A      4/1997

OTHER PUBLICATIONS

United Kingdom, Intellectual Property Office, First office action issued Oct. 18, 2023 for application No. GB2208286.1.

*Primary Examiner* — Sarang Afzali
*Assistant Examiner* — Darrell C Ford
(74) *Attorney, Agent, or Firm* — HOUTTEMAN LAW LLC

(57) ABSTRACT

The present disclosure provides a pad for pressing a flexible display panel having at least one through hole to attach the flexible display panel to a cover glass. The pad includes a main body portion made of an elastic material. A surface of one side of the main body portion is a press surface for applying pressure to the flexible display panel. The main body portion is provided with at least one hollow structure, each hollow structure is provided with a first opening on the press surface, and each first opening corresponds to the at least one through hole of the flexible display panel. The embodiment of the present disclosure also provides a method for manufacturing a display device.

13 Claims, 6 Drawing Sheets

(58) Field of Classification Search
USPC .................. 345/156; 349/58; 361/679.02
See application file for complete search history.

(56) References Cited

U.S. PATENT DOCUMENTS

| | | | | |
|---|---|---|---|---|
| 5,066,320 | A * | 11/1991 | Lehto | C03B 23/0307 65/288 |
| 5,928,464 | A * | 7/1999 | Scharrenberg | B29C 70/683 425/502 |
| 6,318,125 | B1 * | 11/2001 | Diederen | C03B 23/0352 65/102 |
| 8,033,138 | B2 * | 10/2011 | Hori | C03B 23/0305 65/106 |
| 10,194,538 | B2 * | 1/2019 | Lee | B32B 3/28 |
| 11,280,939 | B2 * | 3/2022 | Wakatsuki | G02B 5/0226 |
| 11,448,802 | B2 * | 9/2022 | Wakatsuki | C03B 23/02 |
| 12,127,651 | B1 * | 10/2024 | Trincia | A45C 13/1069 |
| 12,185,632 | B2 * | 12/2024 | Chauvette | H05K 5/0217 |
| 2004/0107729 | A1 * | 6/2004 | Fukami | C03B 35/145 65/273 |
| 2006/0153943 | A1 * | 7/2006 | Lin | B29C 53/04 425/394 |
| 2009/0117332 | A1 * | 5/2009 | Ellsworth | F24S 23/71 126/684 |
| 2010/0284132 | A1 * | 11/2010 | Yi | B29C 45/14688 361/679.01 |
| 2012/0267369 | A1 * | 10/2012 | Duvigneau | B65D 43/0204 220/795 |
| 2013/0266431 | A1 * | 10/2013 | Moram | F01D 25/24 415/182.1 |
| 2014/0002975 | A1 * | 1/2014 | Lee | B32B 3/28 156/196 |
| 2014/0013803 | A1 * | 1/2014 | Hwang | C03B 23/035 65/273 |
| 2014/0104202 | A1 * | 4/2014 | Choi | B29C 51/266 216/24 |
| 2014/0290309 | A1 * | 10/2014 | Chang | C03B 23/0352 65/106 |
| 2016/0021764 | A1 * | 1/2016 | Lee | B32B 37/30 156/196 |
| 2016/0224822 | A1 * | 8/2016 | Hasegawa | C03C 21/002 |
| 2017/0059749 | A1 * | 3/2017 | Wakatsuki | C03C 21/00 |
| 2018/0134022 | A1 * | 5/2018 | Kim | B32B 38/18 |
| 2019/0329540 | A1 * | 10/2019 | Kim | B32B 7/12 |
| 2022/0185112 | A1 * | 6/2022 | Kashima | B60K 35/22 |

* cited by examiner

PAD AND METHOD FOR MANUFACTURING A DISPLAY DEVICE

TECHNICAL FIELD

An embodiment of the present disclosure relates to the technical field of manufacturing a display device, in particular to a pad and a method for manufacturing a display device.

BACKGROUND

In some process of manufacturing a curved display device, a flat flexible display panel and a rigid cover glass with a curved surface in a required shape may be manufactured firstly, then the flexible display panel is provided between a pad and the cover glass, and the pad is made to move towards the cover glass, so that the flexible display panel is pressed to be "attached" to the cover glass, forming a curved surface matched with the cover glass, and the flexible display panel is bonded with the cover glass.

Some of existing flexible display panels are directly provided with through holes for providing external devices such as a camera and a microphone, but when the flexible display panel provided with the through holes is pressed by the pad, cracks are easily generated at the through hole to cause defects (such as failure of the flexible display panel).

SUMMARY

Embodiments of the present disclosure provide a pad and a method for manufacturing a display device.

In a first aspect, the present disclosure provides a pad for pressing a flexible display panel having at least one through hole to attach the flexible display panel to a cover glass, where the pad includes a main body portion made of an elastic material, and a surface of one side of the main body portion is a press surface for applying pressure to the flexible display panel; where the main body portion is provided with at least one hollow structure, each hollow structure is provided with a first opening on the press surface, and each first opening corresponds to the at least one through hole of the flexible display panel.

In some embodiments, the press surface includes a central region and an edge bending region connected to at least one edge of the central region.

In some embodiments, the first opening is provided in the central region, and the central region includes a convex arc surface with a curvature radius of 1000 mm to 1250 mm.

In some embodiments, each first opening corresponds to one of the at least one through hole.

In some embodiments, the first opening is bigger than or equal to a second opening of the through hole corresponding to the first opening, and the second opening is an opening of the through hole on a surface of the flexible display panel facing the pad.

In some embodiments, a shape of the first opening is the same as that of the second opening of the through hole corresponding to the first opening, and a size of the first opening is larger than that of the second opening of the through hole corresponding to the first opening.

In some embodiments, when a geometric center of the first opening is coincident with a geometric center of the second opening and all of sides of the first opening and corresponding sides of the second opening are parallel to each other, respectively, a distance between corresponding sides of the first opening and the second opening is between 0.5 mm and 1.2 mm.

In some embodiments, the hollow structure is a groove opening on the press surface.

In some embodiments, a depth of the groove is between 0.5 mm and 2 mm.

In some embodiments, a bottom surface of the groove is larger than the first opening.

In some embodiments, a shape of the bottom surface of the groove is the same as that of the first opening, and an orthographic projection of the first opening on the bottom surface of the groove is a first projection, a geometric center of the first projection is coincided with a geometric center of the bottom surface of the groove, all of sides of the first projection and corresponding sides of the bottom surface of the groove are parallel to each other, respectively, and a distance between corresponding sides of the first projection and the bottom surface of the groove is between 0.2 mm and 2.5 mm.

In a second aspect, embodiments of the present disclosure provide a method for manufacturing a display device, including: providing a flexible display panel having at least one through hole between a cover glass and the press surface of the pad of any one of above embodiments, such that the first opening faces a corresponding through hole; and relatively approaching the pad to the cover glass, and pressing the flexible display panel to attach the flexible display panel to the cover glass.

In some embodiments, when the flexible display panel is provided between the cover glass and the press surface of the pad, a distance between a geometric center of the first opening and a geometric center of the flexible display panel is smaller than a distance between a geometric center of the second opening of the through hole corresponding to the first opening and the geometric center of the flexible display panel.

In some embodiments, the geometric center of the first opening is located on a line connecting the geometric center of the second opening of the through hole corresponding to the first opening and the geometric center of the flexible display panel, and a distance between the geometric center of the second opening and the geometric center of the first opening is between 0.5 mm and 1 mm.

In some embodiments, before providing the flexible display panel having the at least one through hole between the cover glass and the press surface of the pad, the method further includes: attaching the flexible display panel to a flexible carrier film to pre-deform the flexible carrier film and the flexible display panel on the flexible carrier film; and providing the flexible display panel having the at least one through hole between the cover glass and the press surface of the pad includes: the flexible display panel having the at least one through hole is provided between the cover glass and the press surface of the pad in such a manner that the flexible carrier film is positioned on a side of the flexible display panel proximal to the pad.

BRIEF DESCRIPTION OF DRAWINGS

Drawings are provided for further understanding of the embodiments of the present disclosure, constitute a part of the specification, illustrate the present disclosure together with the embodiments of the present disclosure, and do not limit the present disclosure. The above and other features and advantages will become more apparent to one of ordinary skill in the art by describing exemplary embodiments in detail with reference to the drawings, in which.

Figure 1:
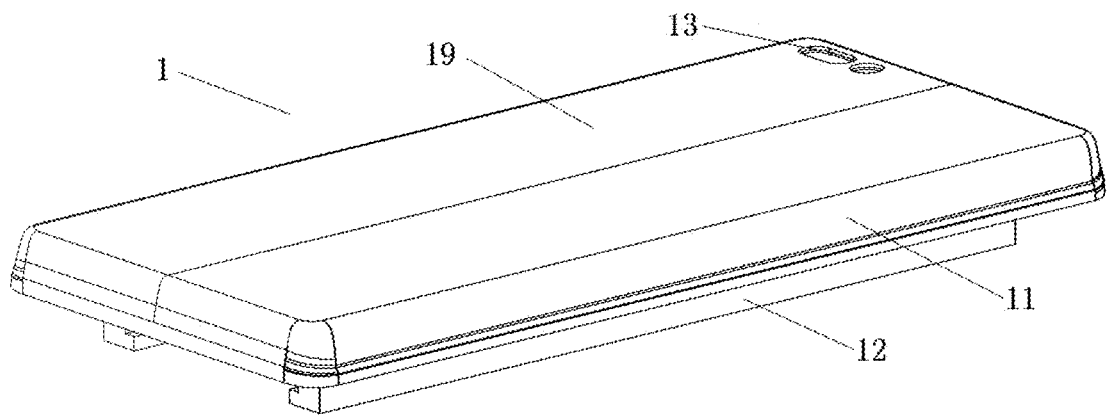
FIG. 1 is a schematic structural diagram of a pad according to an embodiment of the present disclosure.

1. pad; 11. main body portion; 12. connection structure; 13. hollow structure; 131. first opening; 19. press surface; 2. cover glass; 3. flexible display panel; 31. through hole; 311. second opening; 4. carrier film.

DETAIL DESCRIPTION OF EMBODIMENTS

In order to make one of ordinary skill in the art better understand technical solutions of embodiments of the present disclosure, a pad and a method for manufacturing a display device according to the embodiments of the present disclosure will be described below in detail with reference to the drawings.

The embodiments of the present disclosure will be described more fully hereinafter with reference to the drawings, but the embodiments shown may be embodied in different forms and should not be construed as limited to the embodiments set forth herein. Rather, these embodiments are provided so that the present disclosure will be thorough and complete, and will fully convey a scope of the present disclosure to one of ordinary skill in the art.

The embodiments of the present disclosure may be described with reference to plan and/or cross-sectional diagrams by way of ideal schematic diagrams of the present disclosure. Accordingly, example diagrams may be modified in accordance with manufacturing techniques and/or tolerances.

The embodiments of the present disclosure and features of the embodiments may be combined with each other without conflict.

Terms used in the present disclosure are only used for describing particular embodiments and are not intended to limit the present disclosure. As used in the present disclosure, the term "and/or" includes any and all combinations of one or more of associated listed items. As used in the present disclosure, singular forms "a", "an" and "the" are intended to include plural forms as well, unless the context clearly indicates otherwise. As used in the present disclosure, the terms "comprise", "comprising", "include", "including", "made of . . . " specify presence of stated features, integers, steps, operations, elements, and/or components, but do not preclude presence or addition of one or more other features, integers, steps, operations, elements, components, and/or groups thereof.

Unless otherwise defined, all terms (including technical and scientific terms) used in the present disclosure have a same meaning as commonly understood by one of ordinary skill in the art. It will be further understood that terms, such as those defined in common dictionaries, should be interpreted as having a meaning that is consistent with their meaning in the context of the related art and the present disclosure, and will not be interpreted as having a meaning in an idealized or overly formal sense, unless expressly so defined herein.

The embodiments of the present disclosure are not limited to the embodiments shown in the drawings, but include modifications of configurations formed based on a manufacturing process. Thus, regions illustrated in the drawings have schematic properties, and shapes of the regions shown in the drawings illustrate specific shapes of regions of elements, but are not intended to be limiting.

In a first aspect, an embodiment of the present disclosure provides a pad 1 for pressing a flexible display panel 3 having at least one through hole 31 to attach the flexible display panel 3 to a cover glass 2.

Figure 13:
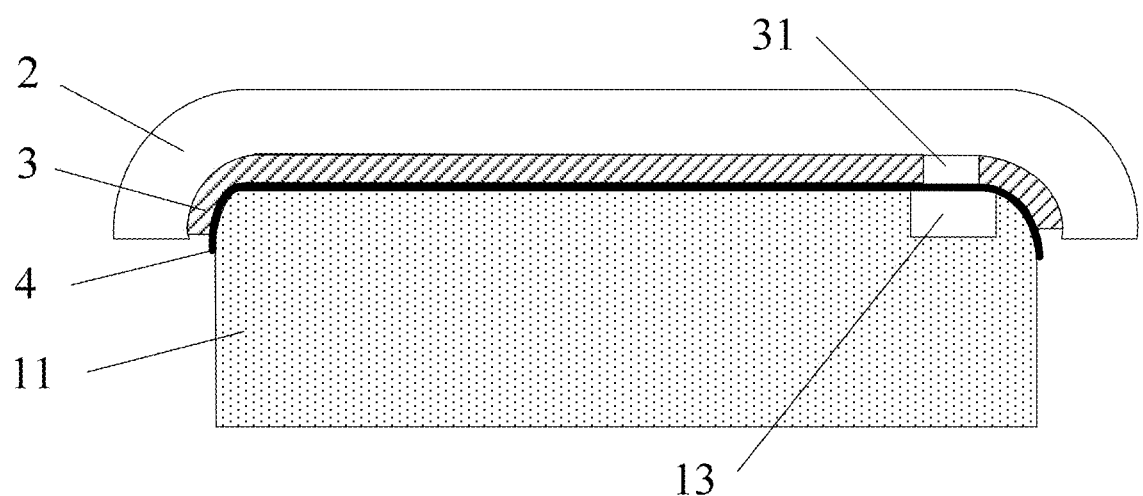
FIG. 13 is a schematic structural diagram illustrating a press process in a method for manufacturing a display device according to an embodiment of the present disclosure.

Referring to FIG. 13, in a process of manufacturing a display device, a flat flexible display panel 3 and a rigid cover glass 2 with a curved surface in a required shape may be manufactured firstly, then the flexible display panel 3 is provided between the pad 1 of the embodiment of the present disclosure and the cover glass 2, and the pad 1 is moved towards the cover glass 2, so that the flexible display panel 3 is pressed to be "attached" to the cover glass 2, forming a shape matched with the cover glass 2, and the flexible display panel 3 is bonded with the cover glass 2.

The flexible display panel 3 to which the pad 1 of the embodiment of the present disclosure is applied already has a display function by itself, and the cover glass 2 is equivalent to a "housing" of the display device, and thus plays a role of protecting the flexible display panel 3 and forming the flexible display panel 3 into a desired shape.

On one hand, the flexible display panel 3 is flexible, so that the flexible display panel 3 may be bent and deformed into a required shape under an action of force; on the other hand, the flexible display panel 3 further has the at least one through hole 31 penetrating through the flexible display panel 3, and the through hole 31 is used for passing through external devices such as a camera, a microphone, and the like.

Figure 15:
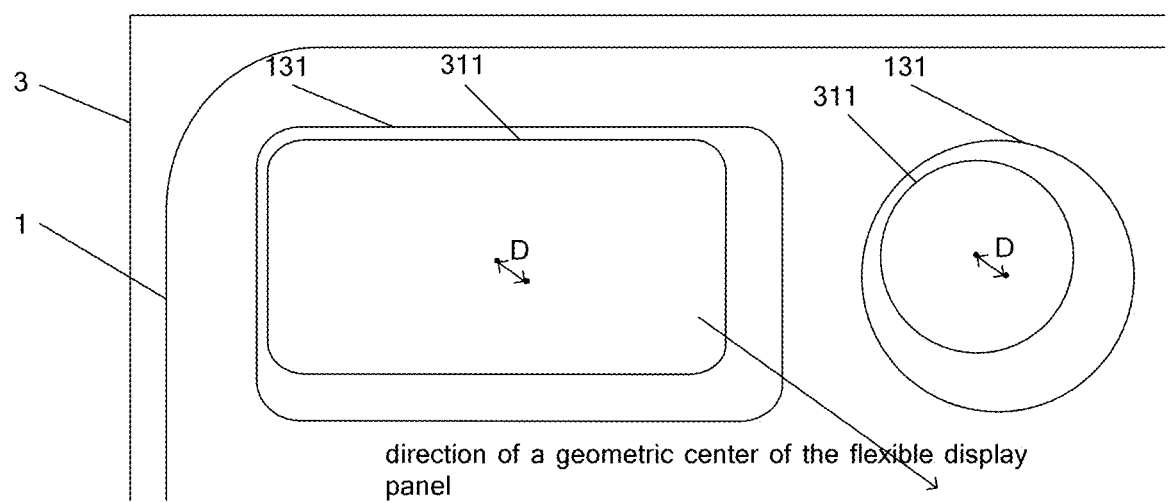
FIG. 15 is a schematic diagram illustrating a relative position relationship between a first opening and a second opening when a flexible display panel is provided between a pad and a cover glass in a method for manufacturing a display device according to an embodiment of the present disclosure.

For example, referring to FIG. 15, the flexible display panel 3 has an elongated through hole and a circular through hole.

Specific position, number, shape, size, etc. of the through hole 31 on the flexible display panel 3 may be adjusted according to a need, and will not be described in detail herein.

Specifically, the flexible display panel 3 may be any display panel capable of implementing flexible display, such as an Organic Light Emitting Diode (OLED) display panel, and will not be described in detail herein.

It should be understood that the flexible display panel 3 may actually include a plurality of different structural layers stacked on top of each other. For example, the flexible display panel 3 necessarily includes a display layer for displaying (such as a display layer with organic light emitting diodes), and may further include other structural layers such as a touch control layer (TP), a heat dissipation layer (SCF), a polarizer (POL), a back film layer, and an adhesive layer (OCA) for bonding the different layers, and the structural layers also serve as "packaging" the display layer.

It should be understood that the different structural layers in the flexible display panel 3 may have different areas, and thus the specific structural layers in different locations of the flexible display panel 3 may be different. However, all structural layers should be flexible, so that the flexible display panel 3 is flexible as a whole.

Meanwhile, the through hole 31 should penetrate through the whole flexible display panel 3, or in other words, the through hole 31 through all the structural layers of the flexible display panel 3 where the through hole 31 is located.

The pad 1 of the embodiment of the present disclosure includes a main body portion 11 made of an elastic material, and a surface on a side of the main body portion 11 is a press surface 19 for applying force to the flexible display panel 3.

The pad 1 of the embodiment of the present disclosure includes a main body portion 11, and the main body portion 11 is made of an elastic material. The elastic material is a material which may generate larger elastic deformation when being applied with a force and may basically recover the original shape after the force is lost.

For example, the elastic material may be a material having a compression elastic deformation rate of at least 10%, and specifically may be a rubber material such as silicone rubber.

Figure 2:
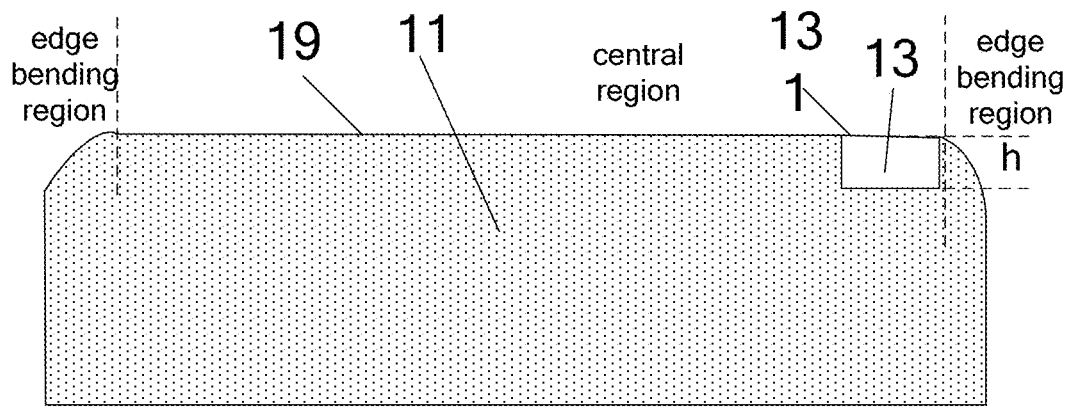
FIG. 2 is a schematic cross-sectional structural diagram of a pad according to an embodiment of the present disclosure.

Referring to FIGS. 1 and 2, one surface of the main body portion 11 is a surface for pressing the flexible display panel 3 by applying a force to the flexible display panel 3, and the surface should have a shape substantially matching the corresponding cover glass 2 when there is no force applied to the surface, so that the flexible display panel 3 may be pressed and attached to the cover glass 2 and formed into a desired shape. For example, referring to FIG. 1, the press surface 19 may be substantially flat in the middle and has a bent curved surface at side edges.

The main body portion 11 has at least one hollow structure 13, each hollow structure 13 has a first opening 131 on the press surface 19, and each first opening 131 corresponds to the at least one through hole 31 of the flexible display panel 3.

Referring to FIGS. 1 and 2, in the pad 1 of the embodiment of the present disclosure, a part of the main body portion 11 is "hollow", that is, the hollow structure 13 without the elastic material, and the hollow structure 13 is further connected to the press surface 19, so that the first opening 131 is formed on the press surface 19. Furthermore, the first opening 131 should correspond to the through hole 31 in the flexible display panel 3, that is, when the flexible display panel 3 is provided between the main body portion 11 and the cover glass 2 in a correct manner, the above "first opening" should be provided at the press surface 19 corresponding to each through hole 31, or in other words, the through hole 31 directly corresponds to the hollow structure 13 of the main body portion 11 instead of the solid portion of the main body portion 11.

Figure 3:
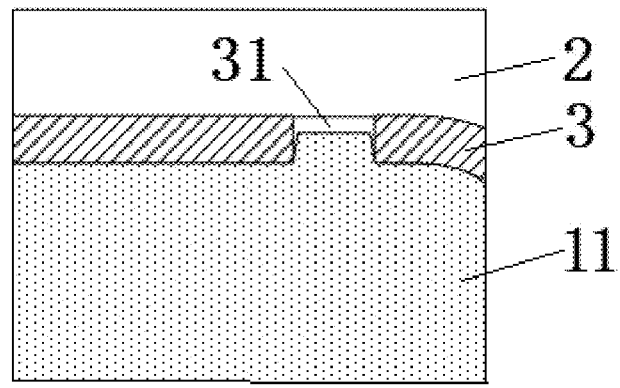
FIG. 3 is a schematic diagram of a flexible display panel cracking due to a pressed pad in some related art.

Referring to FIG. 3, in some related arts, there is no opening (of course, there is no hollow structure either) on the press surface 19 of the main body portion 11 of the pad 1, so that during the press process, the flexible display panel 3 corresponds to the solid portion of the main body portion 11 at the through hole 31, and thus, when the main body portion 11 is elastically deformed, a part of the main body portion 11 is "pressed" into the through hole 31 of the flexible display panel 3, and a large force is applied to the flexible display panel 3 at the through hole 31 (specifically, at a periphery of the through hole 31), thereby causing the flexible display panel 3 to crack at the periphery of the through hole 31, and thus causing defects.

It will be understood that the above cracks may be generated in the display layer of the flexible display panel 3, or in one or more other structural layers (e.g., each of the above structural layers serving as the function of packaging).

Referring to FIG. 13, since the main body portion 11 of the pad 1 of the embodiment of the present disclosure is provided with the first opening 131 at the position corresponding to the through hole 31, in the press process, the main body portion 11 does not press the flexible display panel 3 at the through hole 31 (specifically, at the periphery of the through hole 31), or the press is small, so that the force applied to the flexible display panel 3 at the periphery of the through hole 31 is small, the flexible display panel 3 may be prevented from being torn at the periphery of the through hole 31, and the yield may be improved.

Figure 4:
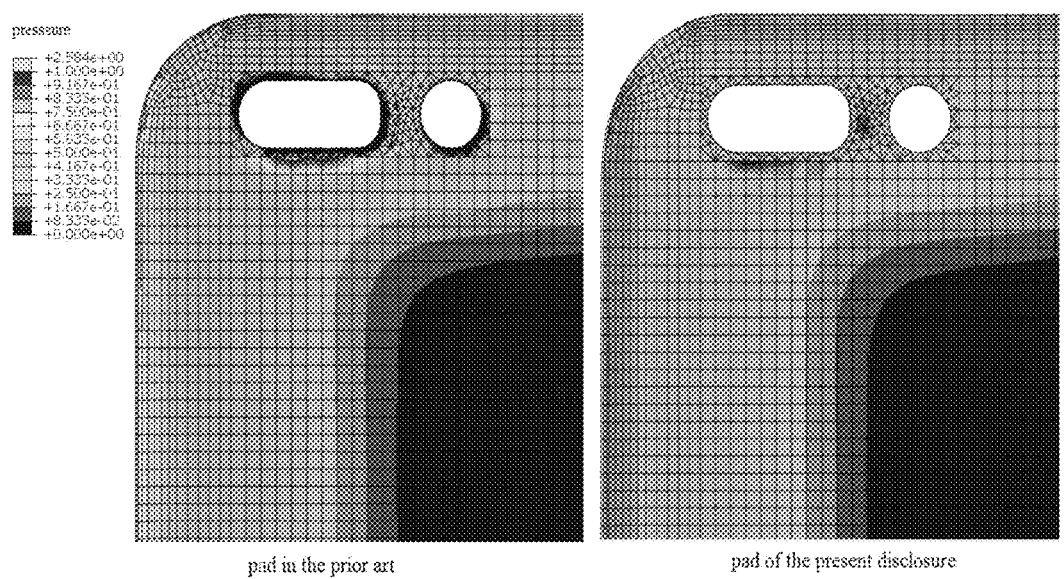
FIG. 4 illustrates simulated distribution plots of pressure on flexible display panels when a pad in an embodiment of the present disclosure is pressed and a pad in a related art is pressed.

For example, referring to FIG. 4, which is simulated distribution plots of the maximum pressure applied to the periphery of the through hole 31 of flexible display panels in a pressing and jointing process for the pad 1 according to the embodiment of the present disclosure (having the first opening 131) and a pad of the related art (without the first opening). It may be seen that, no matter the above elongated through hole or circular through hole, the pressure applied to the periphery is significantly reduced when the pad 1 of the present embodiment is adopted.

In some embodiments, the press surface 19 includes a central region and an edge bending region connected to at least one edge of the central region.

Referring to FIGS. 1 and 2, in a display device in which corresponding edges are curved surface, a middle portion (the central region) of the press surface 19 of the pad 1 may be substantially flat, and edge portions (the edge bending regions) on each side are curved surface bent toward a rear of the pad 1. The embodiments of the present disclosure are more applicable because the flexible display panel 3 is more likely to have cracking problems during the process for manufacturing a curved display device.

It should be understood that for corresponding different curved display devices, the press surface 19 of the pad 1 according to the embodiment of the present disclosure may have a curved edge bending region on only one side, may also have curved edge bending regions on two opposite sides, may also have curved edge bending regions on three sides, and may also have curved edge bending regions on four sides.

Alternatively, the press surface 19 of the pad 1 may not have an edge bending region in a case of manufacturing a flat display device.

In some embodiments, the first opening 131 is provided in the central region, and the central region is a convex arc surface with a curvature radius of 1000 mm to 1250 mm.

In general, the through hole 31 on the flexible display panel 3 is located at a flat middle portion, not at an edge of a curved surface, so the first opening 131 is correspondingly located at the central region. Meanwhile, in order to ensure that each position of the press surface 19 may be well jointed to the cover glass 2, the central region may be a convex arc surface (the central region is also convex in the middle and lower in the periphery) which is slightly bent (the curvature radius R is 1000 to 1250 mm) instead of a plane.

In some embodiments, each first opening 131 corresponds to one through hole 31.

Each first opening 131 corresponds to one through hole 31, which means that: the number of the first openings 131 is the same as the number of the through holes 31; moreover, when the flexible display panel 3 is properly provided between the pad 1 and the cover glass 2, each first opening 131 and a corresponding through hole 31 are provided at least partially opposite to each other.

When there are a plurality of through holes 31 in the flexible display panel 3, each first opening 131 on the press surface 19 may correspond to multiple through holes 31, but in this way, each region between the through holes 31 of the flexible display panel 3 corresponds to the first opening 131 also, so such regions of the flexible display panel 3 cannot be actually pressed by the main body portion 11, such that the attaching of the region of the flexible display panel 3 to the cover glass 2 may be poor. For this reason, each first opening 131 may correspond to only one through hole 31, so that each first opening 131 does not have to be too large with respect to the corresponding through hole 31.

In some embodiments, the first opening 131 is bigger than or equal to a second opening 311 of the through hole 31 corresponding to the first opening 131, and the second opening 311 is an opening of the through hole 31 on a surface of the flexible display panel 3 facing the pad 1.

Figure 5:
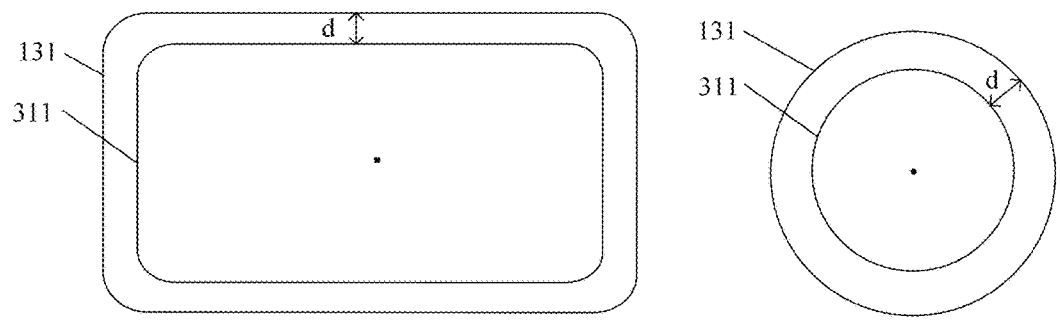
FIG. 5 is a schematic diagram of comparison for a size relationship between a first opening of a pad and a corresponding second opening of a flexible display panel according to an embodiment of the present disclosure (FIG. 5 does not represent an absolute position of the first opening and the second opening)

Referring to FIG. 5, each through hole 31 forms an opening, i.e., the second opening 311, on the side of the flexible display panel 3 facing the pad 1. Each first opening 131 of the main body portion 11 is bigger than or equal to the second opening 311 of the through hole 31 corresponding to the first opening 131, that is, the opening (first opening 131) of the hollow structure 13 may be larger than the opening (second opening 311) of the through hole 31, so that the second opening 311 of the through hole 31 should "not exceed" the first opening 131, and the main body portion 11 may be better prevented from being pressed into the through hole 31 after being deformed, thereby better preventing the flexible display panel 3 from being torn.

In general, a shape and a size of the through hole 31 in the flexible display panel 3 at each position in a depth direction should be the same, so the shape and size of any cross section of the through hole 31 are the same as those of the second opening 311.

In some embodiments, a shape of the first opening 131 is the same as that of the second opening 311 of through hole 31 corresponding to the first opening 131, and a size of the first opening 131 is larger than that of the second opening 311 of through hole 31 corresponding to the first opening 131.

As previously mentioned, the first opening 131 may be "larger" than the second opening 311 of the through hole 31; however, meanwhile, the flexible display panel 3 cannot be effectively "pressed" at a position of the first opening 131 of the main body portion 11, so if the first opening 131 exceeds the second opening 311 too much, more region of the flexible display panel 3 around the through hole 31 is not actually pressed, which affects the effect for attaching the flexible display panel 3 to the cover glass 2.

Further, during the pressing and jointing process, the flexible display panel 3 and the main body portion 11 may be deformed to some extent, and thus sizes and positions of the first opening 131 and the second opening 311 may be changed to some extent.

In this case, in order to ensure that the second opening 311 does not exceed the first opening 131 (to reduce the force applied to the periphery of the through hole 31 of the flexible display panel 3 as much as possible) and to make the first opening 131 as small as possible (to reduce an area of the region of the flexible display panel 3 that is not pressed), referring to FIG. 5, the first opening 131 and the second opening 311 may be designed to have a same shape, but the first opening 131 may be "larger" than the second opening 311, or in other words, the first opening 131 is equivalent to an "enlarged" second opening 311.

It should be understood that FIG. 5 only schematically illustrates the size relationship of the first opening 131 and the second opening 311, and does not represent the actual positional relationship between the first opening 131 and the second opening 311.

In some embodiments, when a geometric center of the first opening 131 is coincident with a geometric center of the second opening 311 and all of sides of the first opening 131 and corresponding sides of the second opening 311 are parallel to each other, respectively (i.e., each side of the first opening 131 is parallel to a side of the second opening 311 corresponding to the side of the first opening 131), a distance between corresponding sides of the first opening 131 and the second opening 311 is between 0.5 mm and 1.2 mm.

Referring to FIG. 5, when the first opening 131 and the second opening 311 have a same shape, if patterns of the first opening 131 and the second opening 311 are placed in a same direction and the geometric centers of the first opening 131 and the second opening 311 are ensured to be coincided, a distance d between corresponding sides of the first opening 131 and the second opening 311 may be the same at each position.

A research shows that the effect of avoiding cracks and ensuring attaching is better when the distance d is 0.5 to 1.2 mm. Further, the distance d may be 0.5 to 1 mm, further may be 0.6 to 0.8 mm, and further may be 0.7 mm, or the like.

For example, when the flexible display panel 3 has one rectangle through hole and one circular through hole, referring to FIG. 1, the number of the first openings 131 in the pad 1 is also two according to the embodiment of the present disclosure, and the first openings 131 are rectangle and circular, respectively, so as to correspond to the rectangle through hole and the circular through hole, respectively.

When the specific position, number, shape, size, etc., of the through holes 31 on the flexible display panel 3 are changed, the specific position, number, shape, size, etc., of the first openings 131 in the pad 1 may also be adjusted accordingly.

It is also possible that the first opening 131 in the pad 1 does not correspond one-to-one to the through holes 31. For example, one first opening 131 may correspond to multiple through holes 31, or some of the through holes 31 may not have corresponding first openings, etc.

In some embodiments, the hollow structure 13 is a groove opening on the press surface 19.

As described above, since the hollow structure 13 is substantially free of the flexible material, if the hollow structure 13 is a hole penetrating the main body portion 11, strength of the main body portion 11 is greatly adversely influenced. Thus, referring to FIGS. 2, 6 and 7, the hollow structure 13 is a groove with a certain depth, rather than a through hole, so as to reduce the adverse influence of the hollow structure 13 on the strength of the main body portion 11 as much as possible.

In some embodiments, a depth of the groove is between 0.5 mm and 2 mm.

Obviously, if the groove is "too deep", it will have a large adverse influence on the strength of the main body portion 11; if the groove is "too shallow", the groove is almost completely absent, and the effect of reducing the force applied to the flexible display panel 3 is not obvious. A research shows that the depth h of the groove may be 0.5 to 2 mm, further may be 0.6 to 1.5 mm and still further may be 0.8 to 1.2 mm.

In some embodiments, a bottom surface of the groove is larger than the first opening 131.

Figure 6:
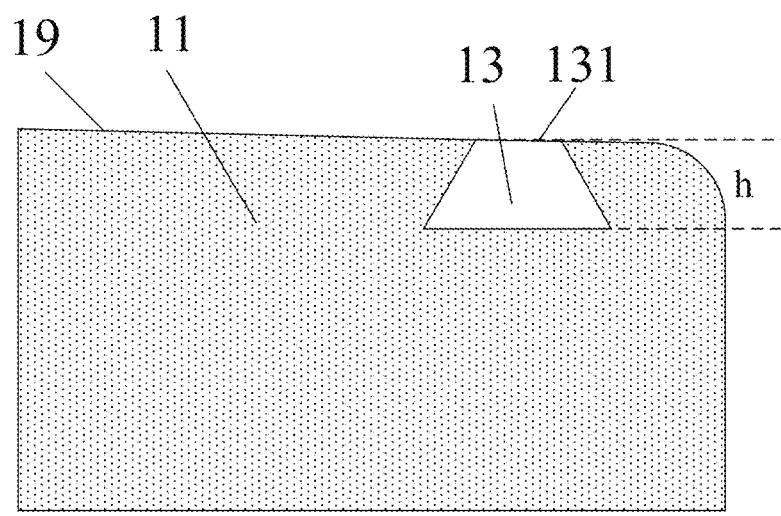
FIG. 6 is a schematic partial cross-sectional structural diagram of another pad at a hollow structure according to an embodiment of the present disclosure.
Figure 7:
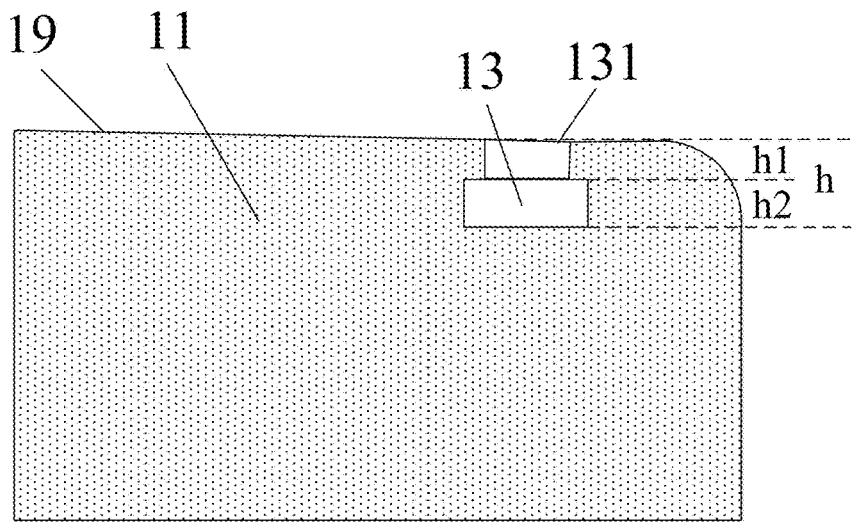
FIG. 7 is a schematic partial cross-sectional structural diagram of another pad at a hollow structure according to an embodiment of the present disclosure.

Referring to FIGS. 6 and 7, the first opening 131 corresponds to a "top" of the groove, and a "bottom" of the groove may be larger than the first opening 131 as the "top" of the groove, i.e., the groove may be in a form of "small-top and large-bottom".

Thus, for the flexible material in the main body portion 11 above a region where the bottom of the groove is enlarged relative to the first opening 131, it is "empty" or "unsupported" from below. Obviously, such flexible material generally corresponds to an edge region of the through hole 31. Thus, the edge region of the through hole 31 of the flexible display panel 3 is pressed by the main body portion 11 to some extent such that the flexible display panel 3 is attached to the cover glass 2, but the force is not too large, so that the flexible display panel 3 at these positions is prevented from cracking due to the too large force.

In some embodiments, the bottom surface of the groove has a same shape as the first opening 131; an orthographic projection of the first opening 131 on the bottom surface of the groove is a first projection, a geometric center of the first projection is coincident with a geometric center of the bottom surface of the groove, all of sides of the first projection and corresponding sides of the bottom surface of the groove are parallel to each other, respectively (i.e., each side of the first projection is parallel to a side of the bottom surface of the groove corresponding to the side of the first projection), and a distance between corresponding sides of the first projection and the bottom surface of the groove is from 0.2 mm to 2.5 mm.

Similar to the relationship between the first opening 131 and the second opening 311, the bottom surface of the groove may also have a same shape as the first opening 131 (and the second opening 311), but have a larger size, and the enlarged size of the bottom surface of the groove (i.e., the above distance d) may be 0.2 to 2.5 mm, further may be 0.5 to 2 mm, still further may be 0.8 to 1.5 mm.

Accordingly, a size difference (i.e., the distance d) between the bottom surface of the groove and the second opening 311 may be 1 to 3 mm, further may be 1.2 to 2.5 mm, and still further may be 1.5 to 2 mm.

An increase transition in the size in a direction from the first opening 131 to the bottom surface of the groove may be implemented in various specific forms.

For example, with reference to FIG. 6, a longitudinal section of the groove is in a form of "trapezoid", i.e., in a depth direction, side walls of the groove gradually expand outwards, so that the bottom surface of the groove is larger than the first opening 131.

As another example, with reference to FIG. 7, the longitudinal section of the groove is in a form of "steps", i.e., sidewalls of the groove expand outwardly at a particular depth. For example, considering an influence of actual manufacturing process, etc., there may be only "two" steps in the longitudinal section of the groove, a depth of an upper step h1 may be 0.5 to 1 mm, and a depth of a lower step h2 may be 0.5 to 1 mm.

In addition to the above main body portion 11, the pad 1 according to the embodiment of the present disclosure may include other structures.

For example, referring to FIG. 1, a connection structure 12 or the like for connection with a pressing device (i.e., a device for driving the pad) may be connected at a side of the main body portion 11 distal to the press surface 19, which will not be described in detail herein.

In a second aspect, an embodiment of the present disclosure provides a method for manufacturing a display device.

The method of the embodiment of the present disclosure is used to attach the flexible display panel 3 to the cover glass 2 by using the above pad 1 to manufacture a display device, especially a curved display device.

Figure 8:
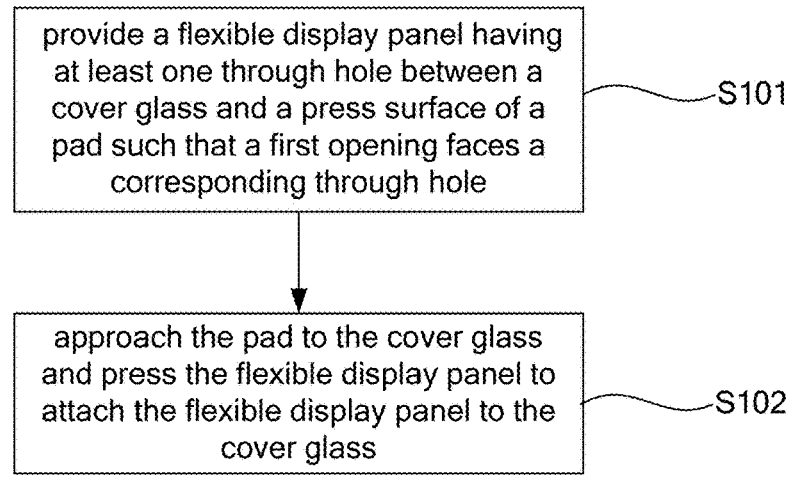
FIG. 8 is a schematic flow chart illustrating a method for manufacturing a display device according to an embodiment of the present disclosure.

Referring to FIG. 8, the method for manufacturing a display device according to an embodiment of the present disclosure includes the following steps S101 to S102.

At step S101, the flexible display panel 3 having at least one the through hole 31 is provided between the cover glass 2 and the press surface 19 of the pad 1 of any one of the above-described embodiments, so that the first opening 131 faces a corresponding through hole 31.

Figure 12:
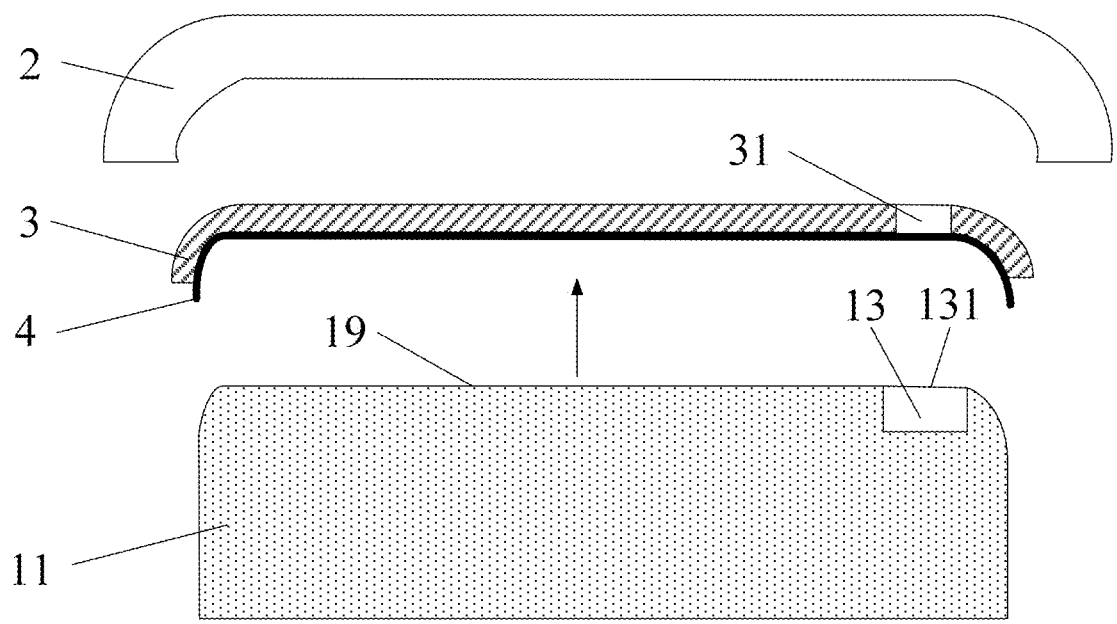
FIG. 12 is a schematic structural diagram illustrating a situation that a flexible display panel is provided between a pad and a cover glass in a method for manufacturing a display device according to an embodiment of the present disclosure.

Referring to FIG. 12, the above flexible display panel 3 having the through hole 31 is provided between the cover glass 2 and the pad 1, and the flexible display panel 3 and the pad 1 may be relatively positioned such that the first opening 131 of the main body portion 11 of the pad 1 faces the through hole 31 on the flexible display panel 3.

In order to ensure that the flexible display panel 3 may be attached to the cover glass 2, an optical adhesive (e.g., OCA adhesive) may be pre-coated on a side of the cover glass 2 facing the flexible display panel 3, which will not be described in detail herein.

At step S102, the pad 1 is relatively approached to the cover glass 2, and the flexible display panel 3 is pressed to attach the flexible display panel 3 to the cover glass 2.

Referring to FIG. 13, the pad 1 is relatively approached to the cover glass 2 (e.g., the pad 1 is pressed against the flexible display panel 3), so that the flexible display panel 3 is pressed between the press surface 19 of the pad 1 and the cover glass 2, gradually deformed, and finally attached (e.g., bonded by the optical adhesive) to the cover glass 2 at one side, and is closely contacted with the press surface 19 of the main body portion 11 of the pad 1 at the other side.

The press surface 19 has a shape substantially corresponding to an inner side of the cover glass 2 (i.e., the side facing the flexible display panel 3), but is still deformed adaptively during the press process, so that finally, both the flexible display panel 3 and the press surface 19 form a shape matching the inner side of the cover glass 2.

Figure 14:
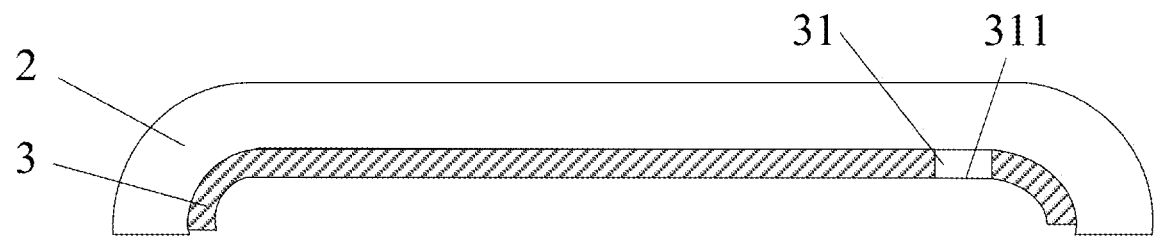
FIG. 14 is a schematic structural diagram of a separated carrier film in a method for manufacturing a display device according to an embodiment of the present disclosure.

Thereafter, referring to FIG. 14, after removing the pad 1, the step of attaching the flexible display panel 3 to the cover glass 2 is completed.

In some embodiments, in a case that the first opening 131 and the second opening 311 (i.e., the opening of the through hole 31) are the same in shape and the first opening 131 is slightly larger in size than the second opening 311, when the flexible display panel 3 is provided between the cover glass 2 and the press surface 19 of the pad 1, a distance between a geometric center of the first opening 131 and a geometric center of the flexible display panel 3 is smaller than a distance between a geometric center of the second opening 311 of the through hole 31 corresponding to the first opening 131 and the geometric center of the flexible display panel 3.

When the first opening 131 and the second opening 311 have the same shape, before the flexible display panel 3 has been provided and starts to be pressed, referring to FIG. 15, the first opening 131 may have a certain "misalignment" with respect to the second opening 311. Specifically, the geometric center of the first opening 131 may not coincide with the geometric center of the second opening 311, but is closer to the geometric center of the flexible display panel 3 (which is the geometric center of the press surface 19 also) than the geometric center of the second opening 311, or in other words, the first opening 131 should be "shifted toward the center" with respect to the second opening 311.

For example, FIG. 15 shows the relative positions of structures of the flexible display panel 3 and the pad 1, or in other words, the relative positions of orthographic projections of the flexible display panel 3 and the pad 1 on a plane parallel to a plane of the press surface 19, viewed from a direction perpendicular to the plane of the press surface 19 after the flexible display panel 3 has been provided.

It may be seen that the first opening 131 may be "closer to the center" (i.e., the geometric center of the flexible display panel 3) than the second opening 311. Because the main body portion 11 of the pad 1 is greatly deformed during the press process, in general, the structure on the press surface 19 is expanded and moved "outward" relative to the flexible display panel 3, and if an initial position of the first opening 131 is "closer to the center" than the second opening 311, the first opening 131 is moved outward and reaches a position "right opposite" to the second opening 311 (for example, the relative positions shown in FIG. 5) after the main body portion 11 is deformed.

In some embodiments, the geometric center of the first opening 131 is located on a line connecting the geometric center of the second opening 311 of the through hole 31 corresponding to the first opening 131 and the geometric center of the flexible display panel 3, and a distance between the geometric center of the second opening 311 and the geometric center of the first opening 131 is between 0.5 mm and 1 mm.

Referring to FIG. 15, the first opening 131 may be closer to the geometric center of the flexible display panel 3 with respect to the second opening 311, and the distance D may be 0.5 to 1 mm, further may be 0.6 to 0.8 mm, and still further may be 0.7 mm.

In some embodiments, before the step of providing the flexible display panel 3 having the at least one the through hole 31 between the cover glass 2 and the press surface 19 of the pad 1 (S101), the method further includes step 100.

At step S100, the flexible display panel 3 is attached to a flexible carrier film 4, to pre-deform the flexible carrier film 4 and the flexible display panel 3 on the flexible carrier film 4.

Accordingly, the step of providing the flexible display panel 3 having the at least one through hole 31 between the cover glass 2 and the press surface 19 of the pad 1 includes: the flexible display panel 3 having the at least one through hole 31 is provided between the cover glass 2 and the press surface 19 of the pad 1 in such a manner that the flexible carrier film 4 is positioned on a side of the flexible display panel 3 close to the pad 1.

Figure 9:
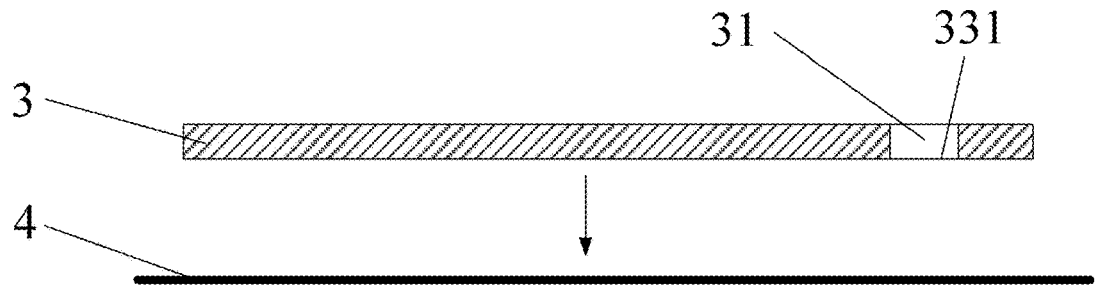
FIG. 9 is a schematic structural diagram illustrating a situation before a flexible display panel is jointed to a carrier film in a method for manufacturing a display device according to an embodiment of the present disclosure.
Figure 10:
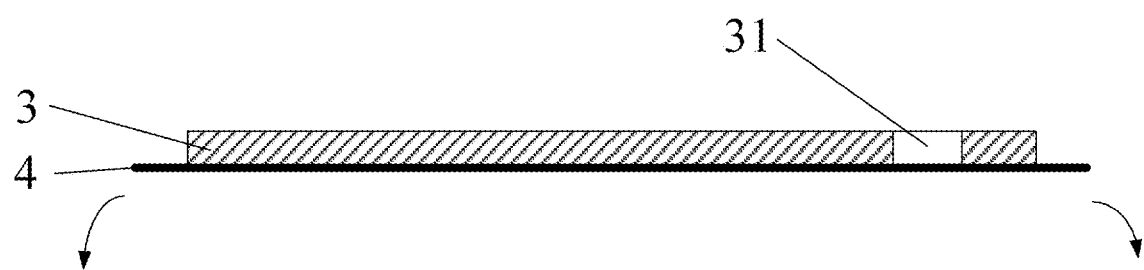
FIG. 10 is a schematic structural diagram illustrating a situation after a flexible display panel is jointed to a carrier film in a method for manufacturing a display device according to an embodiment of the present disclosure.

It is difficult for the pad 1 to directly press the flexible display panel 3 in a completely flat state, which easily causes defects such as wrinkles. Thus, referring to FIGS. 9 and 10, the planar flexible display panel 3 and the planar carrier film 4 are attached first, and are then bonded together by a specific optical adhesive (generally, the carrier film 4 is larger than the flexible display panel 3).

Figure 11:
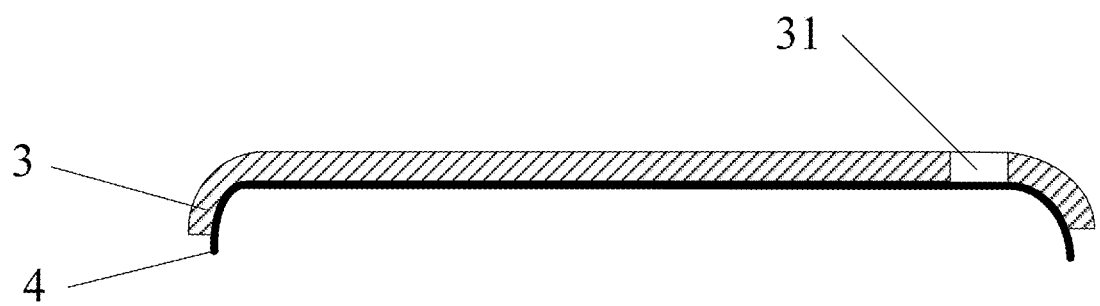
FIG. 11 is a schematic structural diagram illustrating a situation after a flexible display panel and a carrier film are pre-deformed in a method for manufacturing a display device according to an embodiment of the present disclosure.

The carrier film 4 is also flexible and deformable, but has certain strength, so that the deformed shape may be basically maintained. Thus, referring to FIG. 11, a part of edges of the flexible carrier film 4 beyond the flexible display panel 3 is clamped by a plurality of clips, and the flexible carrier film 4 is bent to initially form a shape corresponding to the cover glass 2. The flexible display panel 3 attached to the carrier film 4 is also bent correspondingly, such that the flexible display panel 3 and the carrier film 4 are pre-deformed.

Then, referring to FIGS. 12 to 14, the pre-deformed flexible display panel 3 (and the flexible carrier film 4) is provided between the cover glass 2 and the pad 1 for pressing the pre-deformed flexible display panel 3. The flexible carrier film 4 should be located at a side of the flexible display panel 3 close to the pad 1, that is, during the press process, the flexible carrier film 4 is in an actual contact with the press surface 19.

However, since the flexible carrier film 4 is relatively thin and has limited elastic deformation, if an opening is only provided in the flexible carrier film 4, the effect of reducing cracks in the flexible display panel 3 cannot be achieved.

After the press is completed, referring to FIG. 14, the flexible carrier film 4 is also separated from the flexible display panel 3, so as to obtain a combined structure of the flexible display panel 3 and the cover glass 2. For example, specifically, ultraviolet light (UV) may be used to irradiate an optical adhesive between the flexible carrier film 4 and the flexible display panel 3 to make the optical adhesive deactivated, so as to separate the flexible carrier film 4.

The method for manufacturing the display device according to the embodiment of the present disclosure may further include other necessary manufacturing steps, which are not described in detail herein.

The present disclosure has disclosed example embodiments, and although specific terms are employed, they are used and interpreted in a generic and descriptive sense only and not for purposes of limitation. In some instances, features, characteristics and/or elements described in connection with a particular embodiment may be used alone or in combination with features, characteristics and/or elements described in connection with other embodiments, unless expressly stated otherwise, as would be apparent to one of ordinary skill in the art. Thus, it will be understood by one of ordinary skill in the art that various changes in form and details may be made therein without departing from the scope of the present disclosure as set forth in the claims.

What is claimed is:

1. A pad for pressing a flexible display panel having at least one through hole to attach the flexible display panel to a cover glass, wherein the pad comprises a main body portion, which comprises a solid portion made of an elastic material, and at least one groove penetrating through a part of the solid portion in a thickness direction of the solid portion and opened from a surface of a side of the main body portion which is a press surface for applying pressure to the flexible display panel and each having a bottom within the elastic material; wherein the press surface comprises a central region which is flat and at least one edge bending region which is connected to at least one edge of the central region and which has a rounded corner, on the press surface, and each of the at least one groove is provided with a first opening on the press surface in the central region, and the first opening is configured to directly face one corresponding through hole of the at least one through hole when the flexible display panel is intended to be attached to the cover glass by the pad.

2. The pad according to claim 1, wherein
a bottom surface of the bottom of each of the at least one groove is larger than the first opening.

3. The pad according to claim 2, wherein
a shape of the bottom surface of the groove is the same as that of the first opening, and
an orthographic projection of the first opening on the bottom surface of the groove is a first projection, a geometric center of the first projection is coincided with a geometric center of the bottom surface of the groove, all sides of the first projection and corresponding sides of the bottom surface of the groove are parallel to each other, respectively, and a distance between corresponding sides of the first projection and the bottom surface of the groove is between 0.2 mm and 2.5 mm.

4. The pad according to claim 1, wherein each of the at least one groove comprises a first portion closer to the press surface and a second portion farther away from the press surface in a direction from the press surface to the bottom of the groove, and
an orthographic projection of the first portion on the bottom of the groove is within an orthographic projection of the second portion on the bottom of the groove.

5. The pad according to claim 4, wherein the first portion has a first depth in the direction from the press surface to the bottom of the groove, and the second portion has a second depth in the direction from the press surface to the bottom of the groove; and
the first depth and the second depth each is in a range of 0.5 mm to 1 mm.

6. A method for manufacturing a display device, comprising:
providing a flexible display panel having at least one through hole between a cover glass and the press surface of the pad of claim 1, such that the first opening directly faces the one corresponding through hole; and
approaching the pad to the cover glass, and pressing the flexible display panel to attach the flexible display panel to the cover glass.

7. The method of claim 6, wherein
a shape of the first opening is the same as that of a second opening of the corresponding through hole, and a size of the first opening is larger than that of the second opening of the corresponding through hole; and
the flexible display panel is provided between the cover glass and the press surface of the pad, and a distance between a geometric center of the first opening and a geometric center of the flexible display panel is smaller than a distance between a geometric center of the second opening of the corresponding through hole and the geometric center of the flexible display panel.

8. The method of claim 7, wherein
the geometric center of the first opening is located on a line connecting the geometric center of the second opening of the corresponding through hole and the geometric center of the flexible display panel, and a distance between the geometric center of the second opening and the geometric center of the first opening is between 0.5 mm and 1 mm.

9. The method according to claim 7, wherein
a geometric center of the first opening is coincident with a geometric center of the second opening and all sides of the first opening and corresponding sides of the second opening are parallel to each other, respectively, and a distance between corresponding sides of the first opening and the second opening is between 0.5 mm and 1.2 mm.

10. The method of claim 6, wherein before the step of providing the flexible display panel having the at least one through hole between the cover glass and the press surface of the pad, the method further comprises:
attaching the flexible display panel to a flexible carrier film to pre-deform the flexible carrier film and the flexible display panel on the flexible carrier film; and
the step of providing the flexible display panel having the at least one through hole between the cover glass and the press surface of the pad comprises:
providing the flexible display panel having the at least one through hole between the cover glass and the press surface of the pad in such a manner that the flexible carrier film is positioned on a side of the flexible display panel proximal to the pad.

11. The method according to claim 6, wherein
the press surface comprises a central region and an edge bending region connected to at least one edge of the central region.

12. The method according to claim 11, wherein
the first opening is provided in the central region, and the central region comprises a convex arc surface with a curvature radius of 1000 mm to 1250 mm.

13. The method according to claim 6, wherein
the first opening is bigger than or equal to a second opening of the corresponding through hole, which is an opening of the through hole on a surface of the flexible display panel close to the pad.

* * * * *